United States Patent
Gardner et al.

[19]

[11] Patent Number: 6,018,179
[45] Date of Patent: Jan. 25, 2000

[54] TRANSISTORS HAVING A SCALED CHANNEL LENGTH AND INTEGRATED SPACERS WITH ENHANCED SILICIDATION PROPERTIES

[75] Inventors: Mark I. Gardner, Cedar Creek; Fred N. Hause; Derick J. Wristers, both of Austin, all of Tex.

[73] Assignee: Advanced Micro Devices, Sunnyvale, Calif.

[21] Appl. No.: 09/187,028

[22] Filed: Nov. 5, 1998

[51] Int. Cl.[7] .................................................. H01L 27/088
[52] U.S. Cl. ......................... 257/336; 257/344; 257/408; 257/412; 257/413; 257/900
[58] Field of Search ..................... 257/408, 210, 257/211, 412, 413, 900, 344, 336

[56] References Cited

U.S. PATENT DOCUMENTS

| | | | |
|---|---|---|---|
| 4,074,300 | 2/1978 | Sakai et al. | 357/23 |
| 5,600,168 | 2/1997 | Lee | 257/336 |
| 5,734,185 | 3/1998 | Iguchi et al. | 257/336 |
| 5,834,816 | 11/1998 | Jang | 257/382 |
| 5,834,817 | 11/1998 | Satoh et al. | 257/387 |

*Primary Examiner*—William Mintel
*Attorney, Agent, or Firm*—Bruce E. Garlick

[57] ABSTRACT

A high speed MOS device has a scaled channel length and integrated spacers. The MOS device is formed on a substrate having active and isolation regions. In constructing the MOS device wells and Vt regions are formed as required. Then, a thin nitride layer is formed upon the substrate. Subsequently, an oxide layer is formed upon the nitride layer. Then, the oxide layer is pattern masked to expose gate regions. The gate regions are sloped etched to form slope etched voids. The slope etching may proceed to the nitride layer, through a portion of the nitride layer or fully through the nitride layer, depending upon the embodiment. In another embodiment, the nitride layer is not deposed and the oxide layer is either fully or partially slope etched to the silicon substrate. The patterned mask is then removed and remaining portions of the nitride layer may be converted to an oxynitride. Additionally, a gate oxide may be formed. The slope etched void is then filled with a gate conductor and the surface is planarized in a CMP process. The gate conductor then has a shape wherein its lower surface is smaller than its upper surface. Then, the substrate is isotropically etched to remove portions of the oxide layer and nitride layer unprotected by the gate conductor. The remaining structure includes integrally formed spacers. Active regions, LDD regions and punchthrough regions are then formed to complete formation of the transistor.

12 Claims, 10 Drawing Sheets

TRANSISTORS HAVING A SCALED CHANNEL LENGTH AND INTEGRATED SPACERS WITH ENHANCED SILICIDATION PROPERTIES

BACKGROUND

1. Field of the Invention

The present invention relates generally to integrated circuit manufacture; and more particularly to a method of manufacture of a transistor that has a scaled channel length, integrated spacer formation and enhanced silicidation properties.

2. Description of the Related Art

The structure and the various components, or features, of a metal oxide semiconductor (MOS) devices are generally well known. A MOS transistor typically includes a substrate material onto which a gate insulator and a patterned gate conductor are formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which, a portion of the substrate known as a "well" exists. The well is doped opposite the substrate so that it can accommodate junctions of an impurity type opposite the junction in the non-well areas. Accordingly, wells are often employed when both n-type and p-type transistors (i.e., Complementary MOS, "CMOS") are needed.

A pervasive trend in modern integrated circuit manufacture is to produce transistors having feature sizes as small as possible. To achieve a high density integrated circuit, features such as the gate conductors, source/drain junctions, and interconnects to the junctions must be made as small as possible. Many modern day processes employ features which have less than 0.15 microns critical dimensions. As feature sizes decrease, the size of the resulting transistors as well as the interconnects between transistors also decrease. Smaller transistor size allows more transistors to be placed on a single monolithic substrate, thereby allowing relatively large circuit systems to be incorporated on a single and relatively small die area. Further, smaller transistors typically have lower turn-on threshold voltages, faster switching speeds and consume less power in their operation. These features in combination allow higher speed integrated circuits to be constructed that have greater processing capabilities and that produce less heat.

The benefits of high density circuits can only be realized if advanced processing techniques are used. For example, semiconductor process engineers and researchers often study the benefits of electron beam lithography and x-ray lithography to achieve the higher resolutions needed for submicron features. To some extent, wet etch has given way to a more advanced anisotropic (dry etch) technique. Further, silicides and polycides have replaced higher resistivity contact structures mostly due to the lower resistivity needed when a smaller contact area is encountered.

Many other techniques are often used to achieve a higher density circuit. However, these techniques must contend with problems resulting from higher density itself. Even the most advanced processing techniques cannot, in all instances, offset the problems associated with small features or features arranged extremely close to one another. For example, as the channel length decreases, short channel effects ("SCE") generally occur. SCE cause threshold voltage skews at the channel edges as well as excessive sub-threshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric fields give rise to so called hot carriers and the injection of these carriers into the gate oxide which resides between the substrate (or well) and the overlying gate conductor. Injection of hot carriers should be avoided since these carriers can become trapped and skew the turn-on threshold voltage of the ensuing transistor.

When decreasing features sizes, the dimensions of transistors must remain proportional. Such a technique is typically referred to as "scaling" of transistors. Various problems exist when reducing feature sizes to create a scaled transistor. One such problem relates to the length of the channel region. The scaling of transistors requires that the length of the channel be decreased proportionally. However, available lithography techniques support a minimum channel length due to their resolution, such minimum channel length not sufficient for desired transistor scaling.

Another problem that presents significant problems relates to surface currents, i.e., currents that may travel from source to gate conductor or from drain to gate conductor. As is known, silicidation steps are commonly taken to increase the conductivity of the surfaces of the gate conductor, source and drain. However, with silicidation employed to increase surface conductivity of the source, drain and gate conductor, the likelihood that current will pass along the surface of the transistor from source to gate or drain to gate increases, particularly as the dimensions of the transistor increase. pacers are generally employed to prevent these surface currents. However, as transistor dimensions continue to increase, creation of satisfactorily performing spacers becomes more difficult.

Thus, there exists a need in the art for a better method for forming transistors that have scaled channel lengths but that resist the flow of surface currents.

SUMMARY OF THE INVENTION

The problems outlined above are in large part solved by the transistor formation process according to the present invention in which a transistor is formed having a gate conductor with a reduced channel length as compared to the dimensions of an upper surface of a gate conductor formed therewith. In such formation process, spacers may be integrally formed to correspond to the gate conductor shape such that they provide superior isolation properties.

The method first includes forming active and isolation regions on a substrate. Then, wells and Vt regions may be formed. A thin nitride layer is formed upon the substrate. Subsequently, an oxide layer is formed upon the nitride layer. The oxide layer is then pattern masked to expose gate regions.

The gate regions are slope etched to form slope etched voids. The slope etching may proceed to the nitride layer, through a portion of the nitride layer or fully through the nitride layer, depending upon the embodiment. In another embodiment, the nitride layer is not deposed and, instead, the oxide layer is either fully or partially slope etched to the silicon substrate.

The patterned mask is then removed and remaining portions of the nitride layer may be converted to an oxynitride. Additionally, a gate oxide may be formed. The slope etched void is then filled with a gate conductor and the surface is planarized in a CMP process. The gate conductor then has a shape wherein the area of its lower surface is smaller than the area of its upper surface.

Then, the substrate is isotropically etched to remove portions of the oxide layer and nitride layer unprotected by the gate conductor. The remaining structure includes integrally formed spacers. Active regions, LDD regions and punchthrough regions are then formed. The spacers and portions of the nitride layer residing adjacent the lower surface of the gate conductor may then be removed. A silicidation step may then be performed. Finally, the transistor may be interconnected with like-formed devices to form an integrated circuit.

A transistor formed according to this technique possesses a gate conductor with a unique cross-sectional shape along the channel length, the cross-sectional shape substantially forming an isosceles trapezoid. The top of the isosceles trapezoid is parallel to the bottom of the isosceles trapezoid, the bottom of the isosceles trapezoid adjacent the gate dielectric. The sides of the gate conductor forming the isosceles trapezoid are nonparallel to one another but of equal length and at complementary angles with respect to the tope and bottom of the gate conductor. The cross section of the gate dielectric and the integrally formed spacers combine to form a square or rectangular cross section taken along the channel length.

Thus, a benefit of such a technique for forming a gate conductor is that the channel defined by the lower surface of the gate conductor is shorter than that otherwise obtainable by available lithography techniques. Further, the integral formation of the spacers provides for robust behavior in preventing surface currents.

These and other aspects of the present invention will become apparent with further reference to the drawings and specification which follow.

BRIEF DESCRIPTION OF THE DRAWINGS

A better understanding of the present invention can be obtained when the following detailed description of the described embodiments is considered in conjunction with the following drawings, in which.

DETAILED DESCRIPTION OF THE DRAWINGS

Figure 1A:
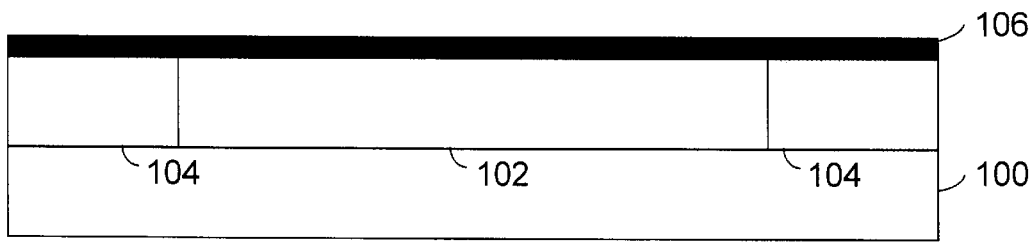
FIGS. 1A through 1C are partial cross-sectional views of a semiconductor substrate illustrating a transistor constructed according to the present invention in stages of formation.
Figure 1B:
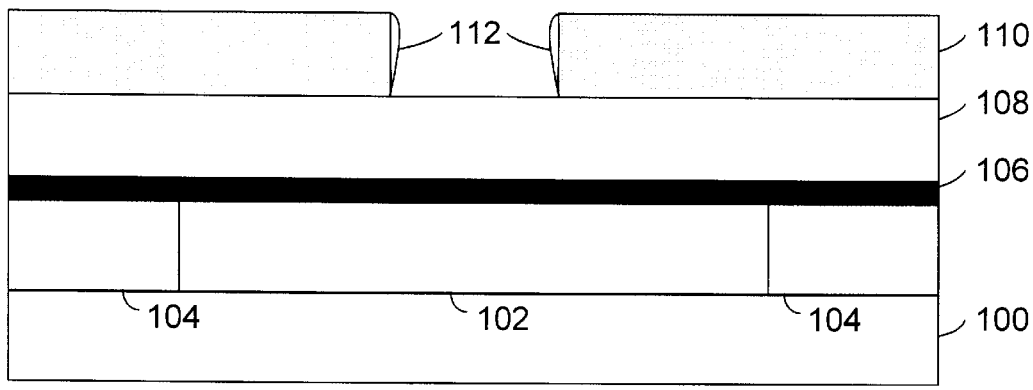
Figure 1C:
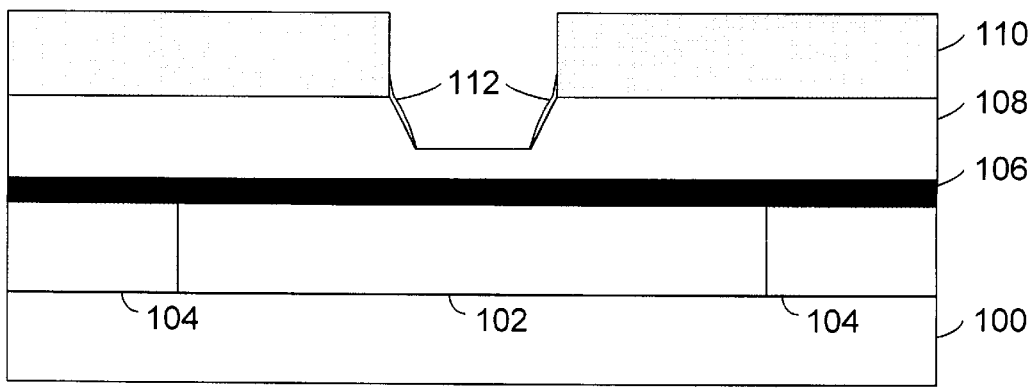

FIGS. 1A through 1C are partial cross-sectional views of a semiconductor substrate illustrating a transistor constructed according to the present invention in stages of formation. Referring now to FIG. 1A, a substrate 100 includes an active region 102 and a plurality of isolation regions 104. Of course, in the manufacture of an integrated circuit, many active regions 102 and many isolation regions 104 would be formed. In general, FIG. 1A represents a substrate after a first step of integrated circuit fabrication process as described herein is performed. The active region 102 is a semiconductive region in which an active device may be formed. The isolation regions 104 are formed of an insulating material that serves to isolate active devices or conductive components from other active devices or conductive components.

For silicon-based semiconductor circuits, the isolation regions 104 are typically formed of silicon dioxide. The isolation regions 104 may be formed using the well known LOCOS growth process, trenching and filling steps or another isolation process. In general, the invention herein includes all forms of creating isolation regions. At this point in the fabrication, wells and Vt implants may also be formed. However, as will become evident to one skilled in the art, the wells and Vt implants may also be formed later in the process.

Continuing to refer to FIG. 1A, it may be seen that a dielectric layer has been formed on top of active region 102 and isolation regions 104. In the described embodiment, the dielectric layer comprises a nitride layer 106 having a thickness of between 8 and 15 angstroms. The nitride layer 106 is either grown or deposited. Nitride is used in the embodiment because it has a dielectric strength of K=8 and because it adequately serves to protect the substrate 100 surface during subsequent steps. However, other materials may also be used, particularly materials having a dielectric strength of between K=8 and K=500.

Referring now to FIG. 1B, it may be seen that an oxide layer 110 has been formed upon the dielectric layer 106. In the embodiment shown, the oxide layer 110 has a thickness of between 1200 and 2500 Angstroms. The oxide layer 110 may be deposited in a chemical vapor deposition (CVD) process or in another known oxide deposition process. Also shown in FIG. 1B is a patterned mask 110 formed of a photoresist that has been deposited across the surface of the dielectric layer 106, has been selectively exposed in a photo lithography step and has had exposed portions removed. The removal of the exposed portions of the patterned mask may be performed in an ashing step. Then, a polymer 112 is applied to the patterned mask 110 which will assist in a subsequent etching step.

Referring now to FIG. 1C, the oxide layer 108 is shown to have been partially etched where it is unprotected by the patterned mask 110. As illustrated, the etching produces a sloped etch pattern such that the upper portion of the etched region has a width commensurate with the width of the patterned mask 110 but the lower portions of the etched region have a lesser width. Such sloped etching is achieved by a series of smaller etch steps in which smaller portions of the oxide layer 108 are removed. During each of the smaller etch steps, the polymer 112 migrates along the walls of the slope etched oxide 108 in a stair step fashion to protect portions of the etched oxide layer 108 during subsequent smaller etch steps. Resultantly, a stair stepped structure is produced that approximates the sloped etch void illustrated.

Figure 2A:
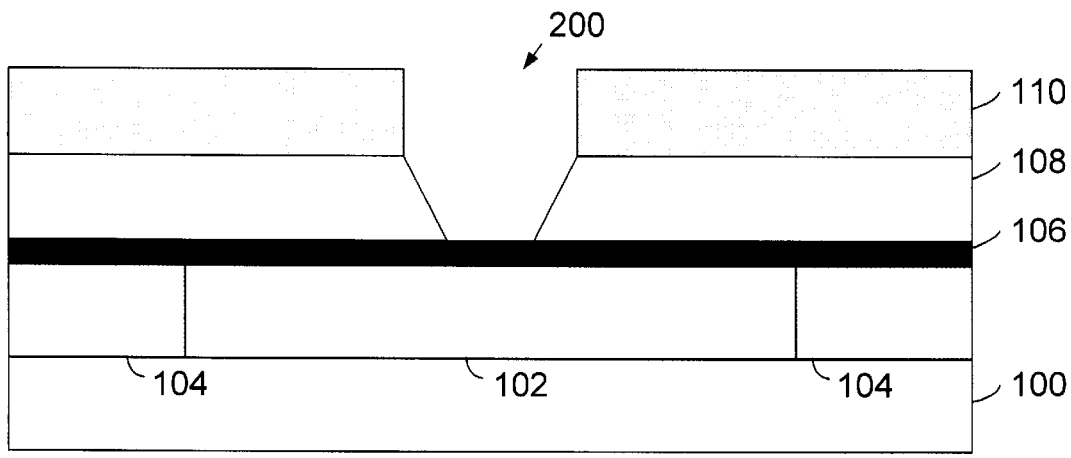
FIGS. 2A through 2F are partial cross sectional views of the semiconductor substrate of FIGS. 1A through 1C illustrating the transistor in subsequent stages of formation according to a first embodiment of the present invention.

FIGS. 2A through 2F are partial cross sectional views of the semiconductor substrate of FIGS. 1A through 1C illustrating the transistor in subsequent stages of formation according to a first embodiment of the present invention. Referring now to FIG. 2A, it may be seen that the etching step(s) have created a sloped etch void 200 in the oxide layer 108 which extends to an upper surface of the nitride layer 106 but that does not extend into the nitride layer 106. Thus, in the embodiment, the prior sloped etch step was selective to the oxide layer 108 but not to the nitride layer 106. Alternatively, the sloped etch step may have been timed so that the etching did not extend into the nitride layer 106.

Figure 2B:
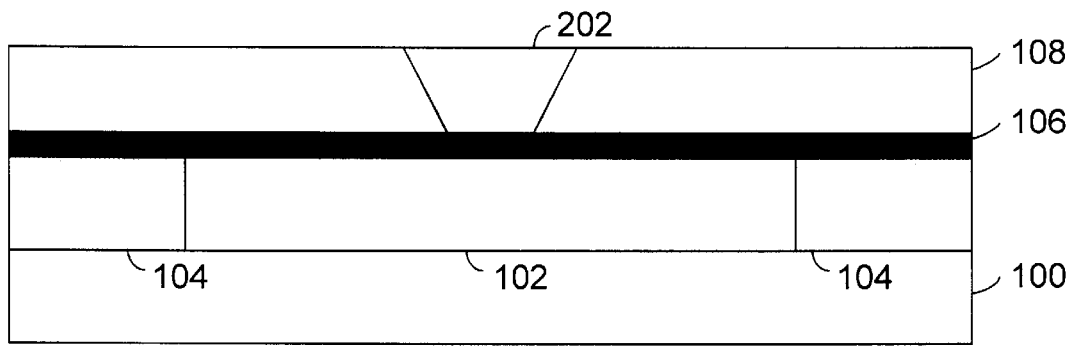

Referring now to FIG. 2B, it is shown that a gate conductor 202 has been formed in the sloped etch void 200 created by the prior sloped etch step. In the embodiment, the patterned mask 110 is first stripped in an ashing step. Then, the sloped etch void 200 is filled with polysilicon in a deposition step to form a gate conductor 202. The polysilicon is either conductive when deposited or subsequently made conductive. After its deposition, the substrate 100 surface is planarized in a chemical mechanical polishing (CMP) step. In an alternative formation, a metal such as tungsten, cobalt, titanium or a related compound may be employed instead of the polysilicon to form the gate conductor 202. In such case, a CMP step would also be employed to form a planar upper surface.

Figure 2C:
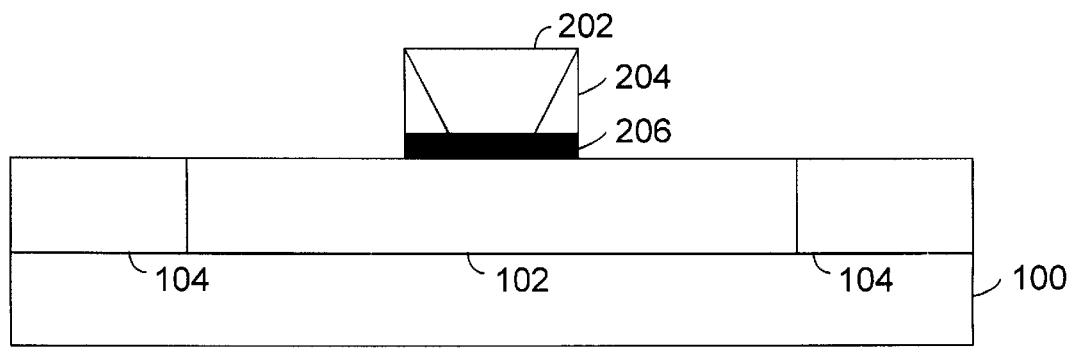

FIG. 2C illustrates the structure after an isotropic etch step has removed portions of the oxide layer 108 and nitride layer 106 unprotected by the gate conductor 202. In such case, the etch step is selective to the oxide layer 108 and nitride layer 106 so as to remove unprotected portions of the layers but not to remove portions of the active region 102 or the isolation regions 104. As shown, a gate structure remains which includes a gate dielectric 206 formed of a remaining portion of the nitride layer 206, the gate conductor 202 and spacers 204.

Figure 2D:
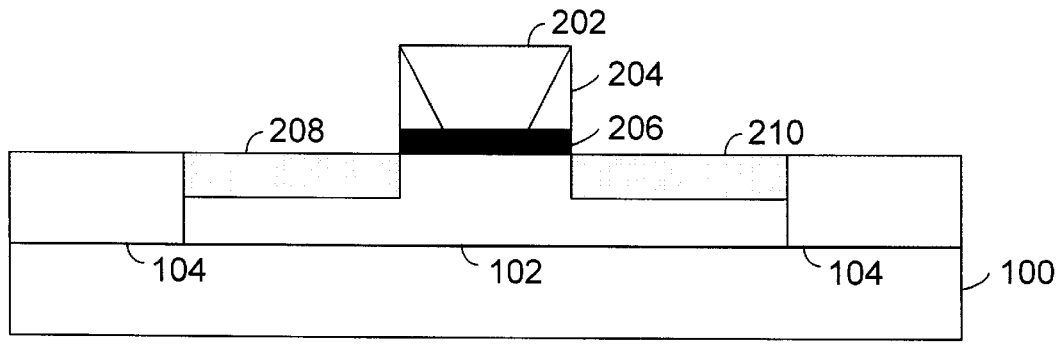

FIG. 2D shows the structure after source 208 and drain 210 have been formed using a known implant step. Such implant step may also dope the gate conductor 202 to make it conductive if it were not previously conductive. As shown, the spacers 204, if retained, will assist in isolating the gate conductor 202 from the source 208 and drain 210, particularly from surface current flow which may be enhanced by subsequent a silicidation step.

Figure 2E:
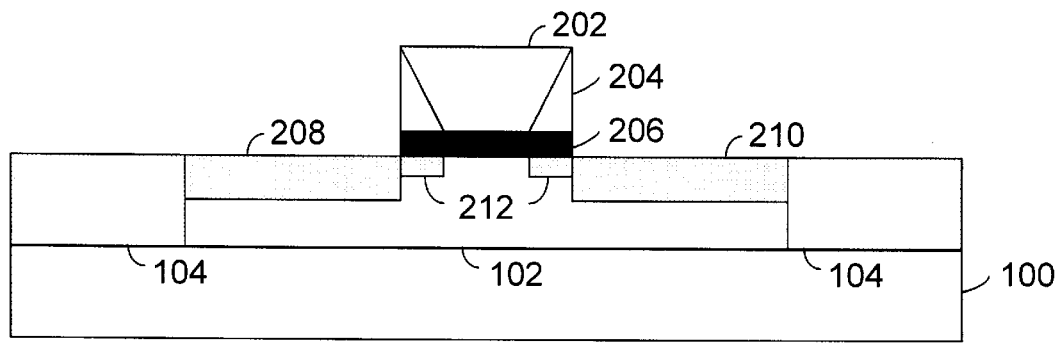

As shown in FIG. 2E, lightly doped drain (LDD) regions 212 are formed adjacent the source 208 and drain 210 regions. The LDD regions 212 are created using a known technique. This known technique may include forming spacers if they had previously been removed. The structure of FIG. 2E represents a complete transistor that may be intercoupled with other like-formed transistors to create an integrated circuit. The LDD regions 212 may also be formed or enhanced using a rapid thermal annealing (RTA) step in which an arsene gas is applied to the structure at a temperature of 750 to 1050 degrees Celsius for a period of 10 to 30 seconds.

Figure 2F:
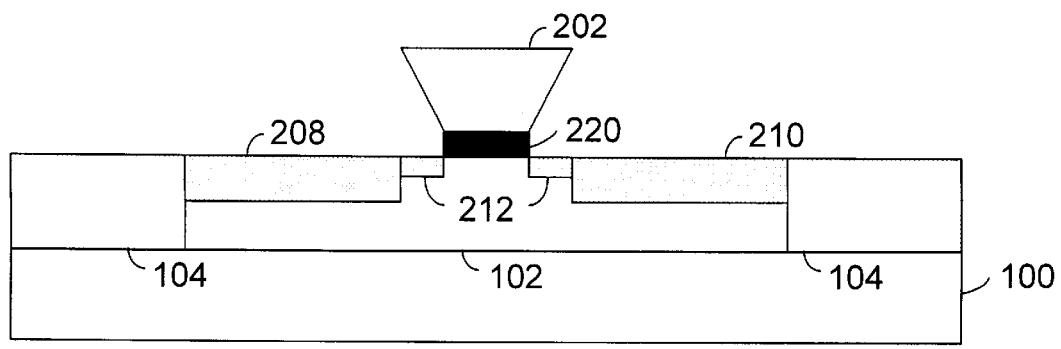

FIG. 2F illustrates an alternate construction of a transistor wherein the spacers 204 and a portion of the nitride layer 206 are stripped. A gate dielectric 220 remaining is formed from a portion of the nitride gate dielectric 206 previously remaining. As is shown, in the alternate construction, LDD regions 212 are also formed. However, in such construction, the LDD regions 212 may be formed subsequent to removal of the spacers 204 and the portion of the nitride gate dielectric 206.

Figure 3A:
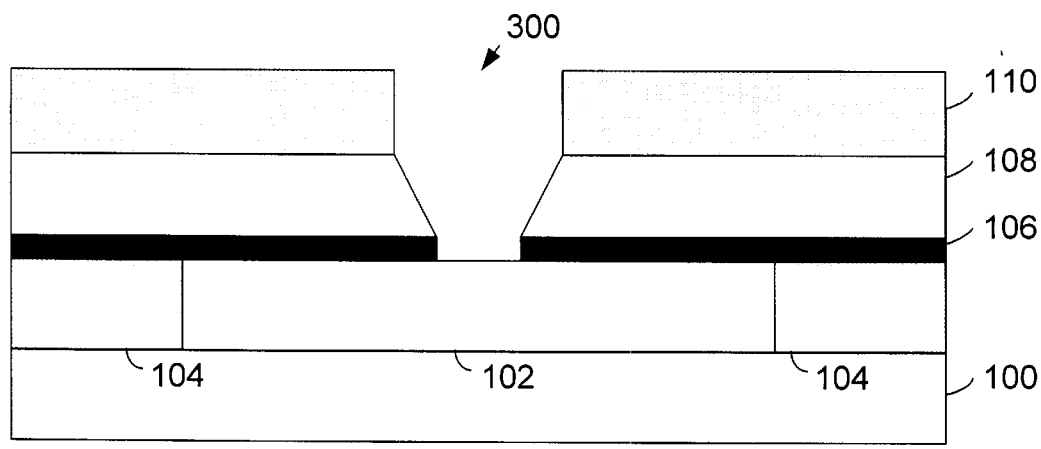
FIGS. 3A through 3F are partial cross sectional views of the semiconductor substrate of FIGS. 1A through 1C illustrating the transistor in subsequent stages of formation according to a second embodiment of the present invention.

FIGS. 3A through 3F are partial cross sectional views of the semiconductor substrate of FIGS. 1A through 1C illustrating the transistor in subsequent stages of formation according to a second embodiment of the present invention. Referring now to FIG. 3A, it may be seen that the etching step(s) have created a sloped etch void 300 in the oxide layer 108 which extends through the nitride layer 106 to the active region 102. Thus, in the embodiment, the prior sloped etch step was selective to both the oxide layer 108 and the nitride layer 106 but not the silicon active region 102. Alternatively, the sloped etch step may have been timed so that the etching did not extend into the active region 102.

Figure 3B:
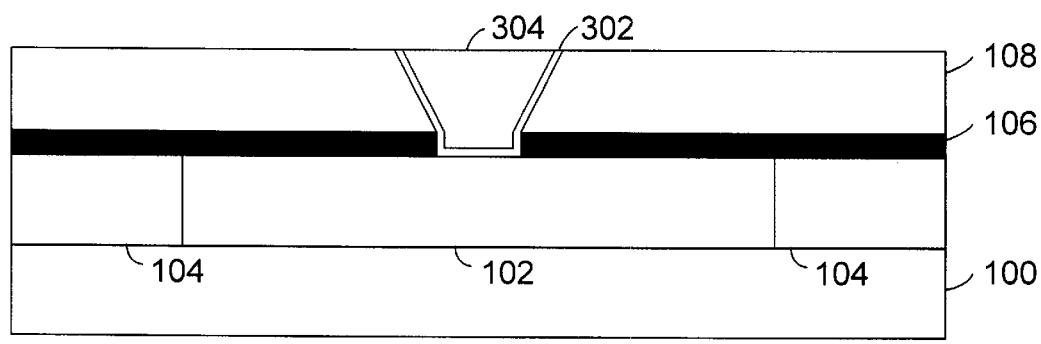

Referring now to FIG. 3B, it is shown that a gate dielectric 302 and a gate conductor 304 have been formed in the sloped etch void 300 created by the prior sloped etch steps. In the embodiment, the patterned mask 110 is first stripped in an ashing step. Then, the gate dielectric 302 is formed in a deposition or growth step in the sloped etch void. Then, the sloped etch void 300 which includes the gate dielectric 302 liner is filled with polysilicon in a deposition step to form a gate conductor 304. The polysilicon is either conductive when deposited or subsequently made conductive. After its deposition, the substrate 100 surface is planarized in a chemical mechanical polishing (CMP) step. In an alternative formation, a metal such as tungsten, cobalt, titanium or a related compound may be employed instead of the polysilicon to form the gate conductor 304. In such case, a CMP step would also be employed to form a planar upper surface.

Figure 3C:
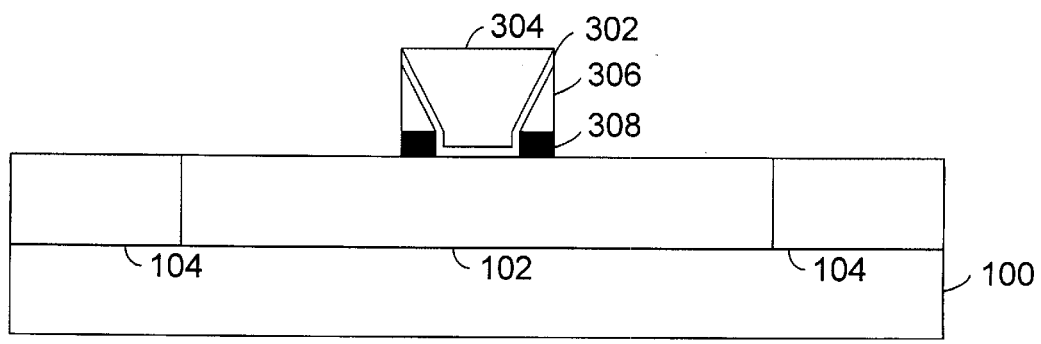

FIG. 3C illustrates the structure after an isotropic etch step has removed portions of the oxide layer 108 and nitride layer 106 unprotected by the gate conductor 304. In such case, the etch step is selective to the oxide layer 108 and nitride layer 106 so as to remove unprotected portions of such but not to etch the active region 102 and the isolation regions 104. As shown, a gate structure remains which includes the gate dielectric 302, the gate conductor 304, spacers 306 and remaining nitride portions 308.

Figure 3D:
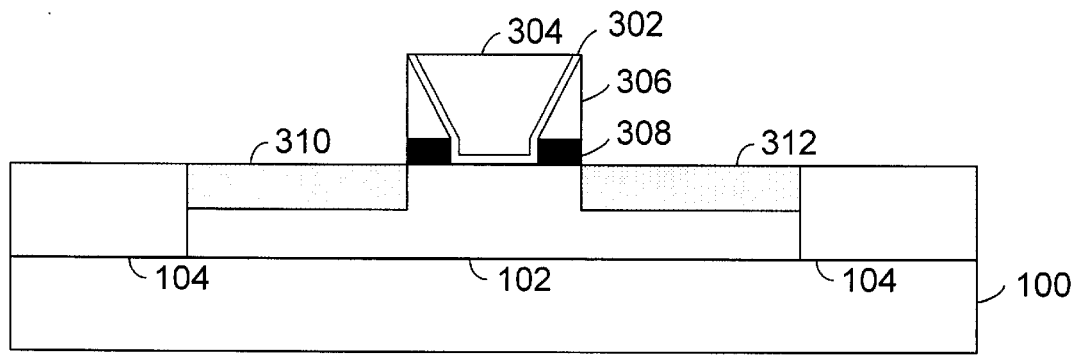

FIG. 3D shows the structure after source 310 and drain 312 have been formed using a known implant step. Such implant step may also dope the gate conductor 304 to make it conductive if it were not previously conductive. As shown, the spacers 306, if retained, will assist in isolating the gate conductor 304 from the source 310 and drain 312, particularly from surface current flow which may be enhanced by subsequent a silicidation step.

Figure 3E:
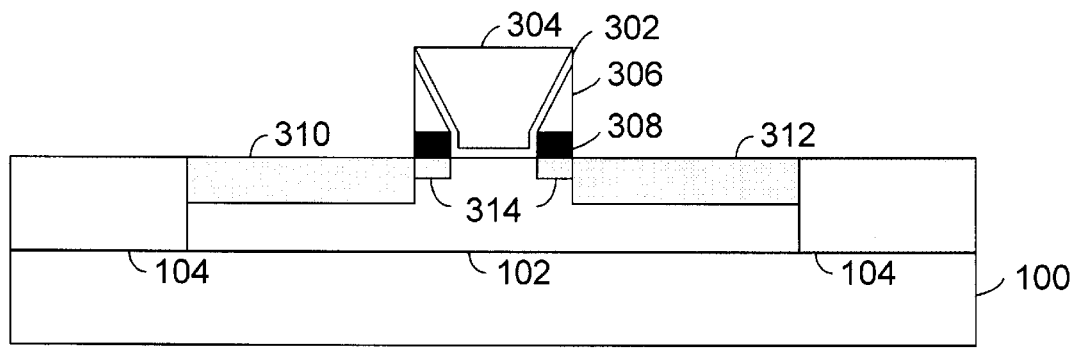

As shown in FIG. 3E, lightly doped drain (LDD) regions 314 are formed adjacent the source 310 and drain 312 regions. The LDD regions 314 are created using a known technique. The structure of FIG. 2E represents a complete transistor that may be intercoupled with other like-formed transistors to create an integrated circuit. Alternately, the LDD regions 314 may be formed or enhanced using a rapid thermal annealing (RTA) step in which an arsene gas is applied at a temperature of 750 to 1050 degrees Celsius for a period of 10 to 30 seconds.

Figure 3F:
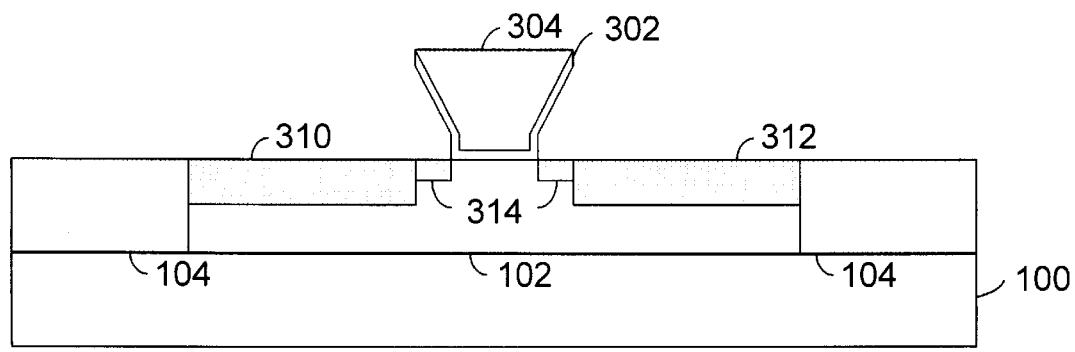

FIG. 3F illustrates an alternate construction of a transistor wherein the spacers 306 and a remaining nitride portions 308 are stripped. As is shown, in the alternate construction, LDD regions 314 are also formed. However, in such construction, the LDD regions 314 may be formed subsequent to removal of the spacers 306 and the remaining nitride portions 308.

Figure 4A:
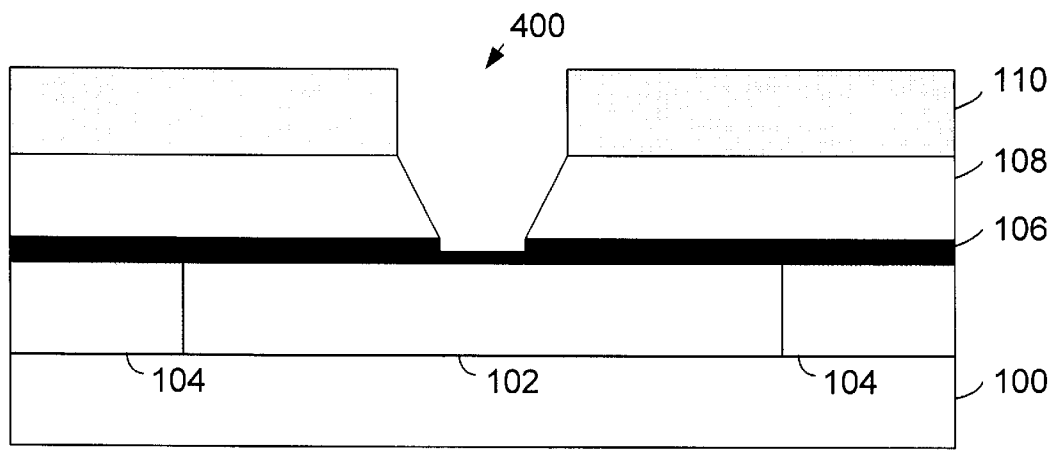
FIGS. 4A through 4F are partial cross sectional views of the semiconductor substrate of FIGS. 1A through 1C illustrating the transistor in subsequent stages of formation according to a third embodiment of the present invention.

FIGS. 4A through 4F are partial cross sectional views of the semiconductor substrate of FIGS. 1A through 1C illustrating the transistor in subsequent stages of formation according to a third embodiment of the present invention. Referring now to FIG. 4A, it may be seen that the etching step(s) have created a sloped etch void 400 in the oxide layer 108 which extends through a portion of the nitride layer 106. Thus, in the embodiment, the prior sloped etch step was selective to both the oxide layer 108 and the nitride layer 106 and timed so that it did not proceed fully through the nitride layer 106.

Figure 4B:
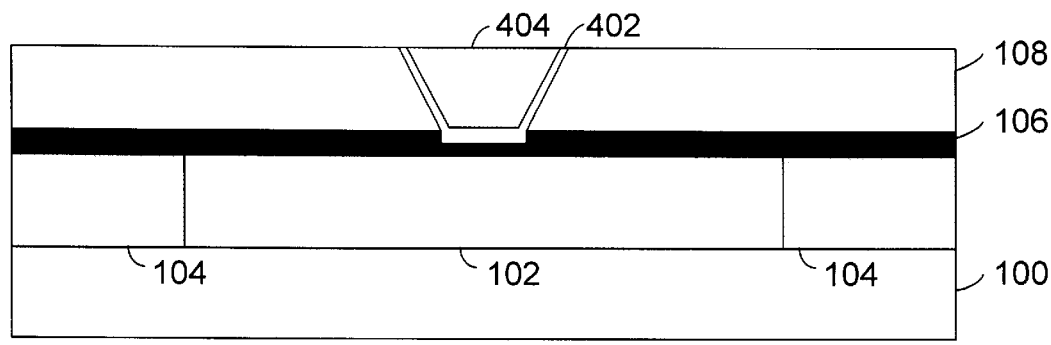

Referring now to FIG. 4B, it is shown that a gate dielectric 402 and a gate conductor 404 have been formed in the sloped etch void 400 created by the prior sloped etch steps. In the embodiment, the patterned mask 110 is first stripped in an ashing step. The exposed portion of the nitride layer 106 may be converted to an oxynitride at this point in the fabrication. Then, the gate dielectric 402 is formed in a deposition or growth step in the sloped etch void 400, including formation upon the remaining portion of the nitride layer 106. Next, the sloped etch void 400 which includes the gate dielectric 402 liner is filled with polysilicon in a deposition step to form a gate conductor 404. The polysilicon is either conductive when deposited or subsequently made conductive. After its deposition, the substrate 100 surface is planarized in a chemical mechanical polishing (CMP) step. In an alternative formation, a metal such as tungsten, cobalt, titanium or a related compound may be employed instead of the polysilicon to form the gate conductor 404. In such case, a CMP step would also be employed to form a planar upper surface.

Figure 4C:
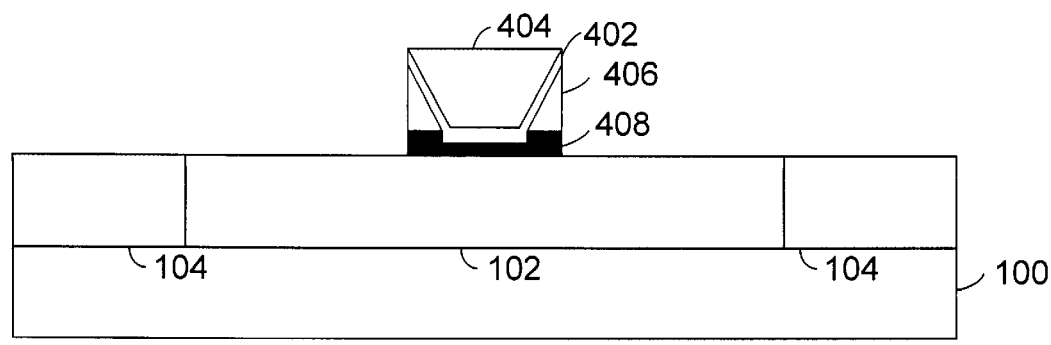

FIG. 4C illustrates the structure after an isotropic etch step has removed portions of the oxide layer 108 and nitride layer 106 unprotected by the gate conductor 404. In such case, the etch step is selective to the oxide layer 108 and nitride layer 106 so as to remove unprotected portions of such but not to etch the active region 102 and the isolation regions 104. As shown, a gate structure remains which includes the gate dielectric 402, the gate conductor 404, spacers 406 and remaining nitride layer portions 408.

Figure 4D:
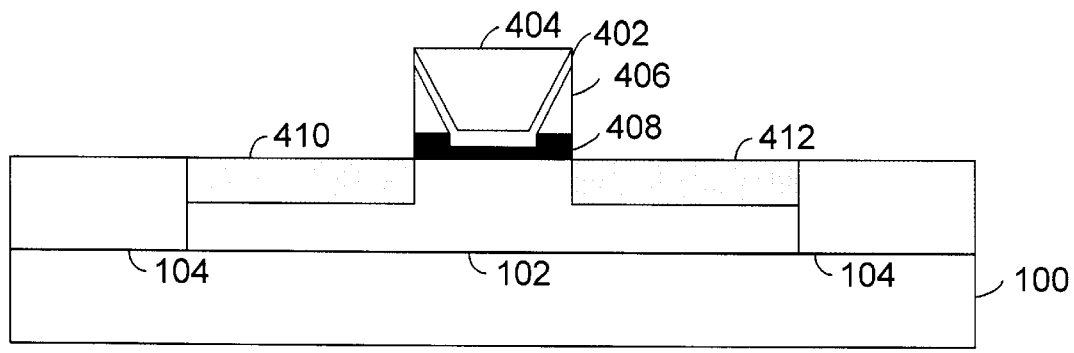

FIG. 4D shows the structure after source 410 and drain 412 have been formed using a known implant step. Such implant step may also dope the gate conductor 404 to make it conductive if it were not previously conductive. As shown, the spacers 406, if retained, will assist in isolating the gate conductor 404 from the source 410 and drain 412, particularly from surface current flow which may be enhanced by subsequent a silicidation step.

Figure 4E:
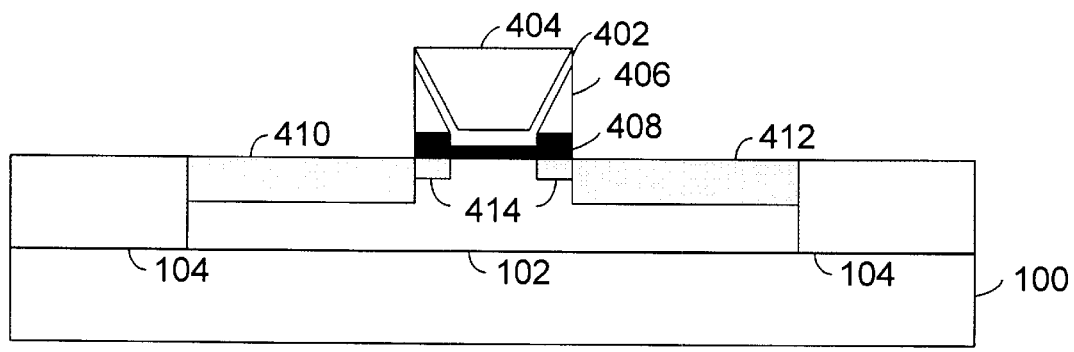

As shown in FIG. 4E, lightly doped drain (LDD) regions 414 are formed adjacent the source 410 and drain 412 regions. The LDD regions 414 are created using a known technique. The structure of FIG. 2E represents a complete transistor that may be intercoupled with other like-formed transistors to create an integrated circuit. Alternately, the LDD regions 414 may be formed or enhanced using a rapid thermal annealing (RTA) step in which an arsene gas is applied at a temperature of 750 to 1050 degrees Celsius for a period of 10 to 40 seconds.

Figure 4F:
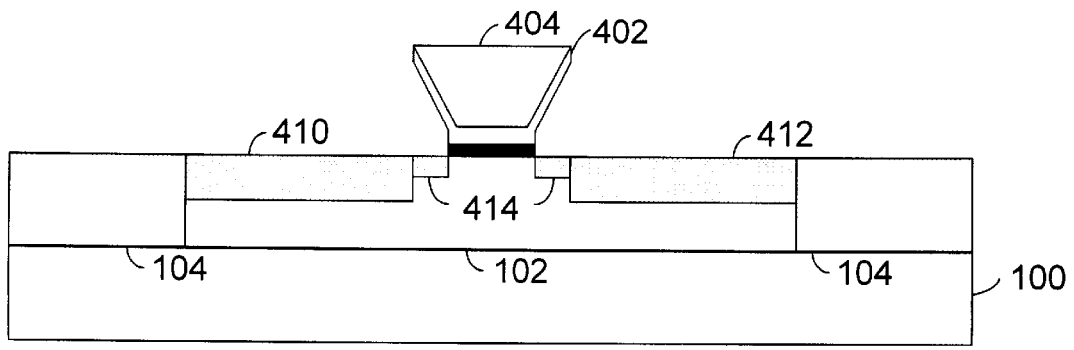

FIG. 4F illustrates an alternate construction of a transistor wherein the spacers 406 and a remaining nitride portions 408 are stripped. As is shown, in the alternate construction, LDD regions 414 are also formed. However, in such construction, the LDD regions 414 may be formed subsequent to removal of the spacers 406 and the remaining nitride portions 408.

Figure 5:
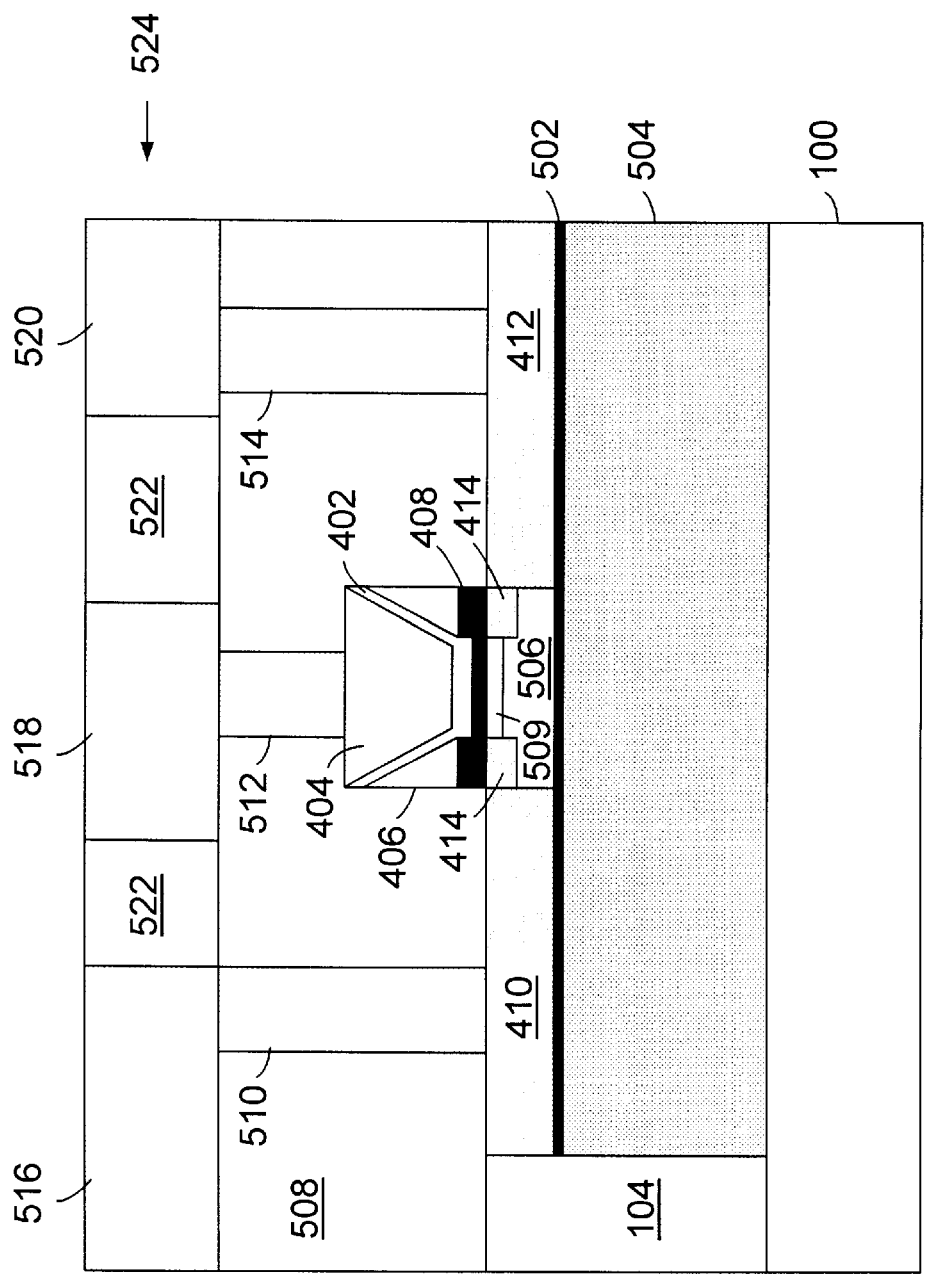
FIG. 5 is a partial cross sectional diagram of an integrated circuit that has been formed according to the present invention that illustrates in detail the components of a transistor and how the transistor can be connected to other transistors to form an integrated circuit.

FIG. 5 is a partial cross sectional diagram of a transistor that has been formed according to the present invention that illustrates in detail the components of the transistor and how the transistor can be connected to other transistors to form an integrated circuit. Referring now to FIG. 5, each of the components as discussed previously with reference to FIGS. 4A through 4F includes the part numbers used to introduce the components. In addition to those components, FIG. 5 illustrates structure in which punchthrough regions 502, wells 504 and Vt implants 509 have been formed.

FIG. 5 also shows interconnection of formed transistors via metallization layers and illustrates the channel region 506 formed between source 410 and drain 412. Punch through region 502 and well 504 are shown to be formed in the active region. Vt implant 509 is shown to reside under the remaining portion 408 of the nitride layer.

An insulation region 508 is formed in a CVD process upon the transistor and other portions of the substrate at a thickness that is required to isolate a first metallization layer 524 of the device of FIG. 5 from transistors and other devices of the integrated circuit. Typically, the insulation region 508 is polished in a CMP process to form a planar upper surface. It is then masked and etched to form openings to the active regions of the transistors (e.g., source 410, drain 412 and gate conductor 404).

Once the openings are formed, a sputtering, deposition or evaporation process, by way of example, is used to fill the vias with a metal. The resulting metallized vias 510, 512 and 514 are formed. Metals that can be used in this process include Ti, TiN, W and Al. The vias 510, 512 and 514 may be deposited in a same step that forms metallization layer 524. The metallization layer 524 is then masked to form a conductor pattern and is etched back to the insulation layer 508 to form the conductors 516, 518 and 520. An insulator layer 522 may be formed to isolate conductive paths 516, 518 and 520 formed in the metallization layer 524, particularly if a subsequent metallization layer is formed upon the metallization layer 524. Subsequent metallization layers (not shown) can provide further interconnections between the devices and external to the formed integrated circuit.

Figure 6:
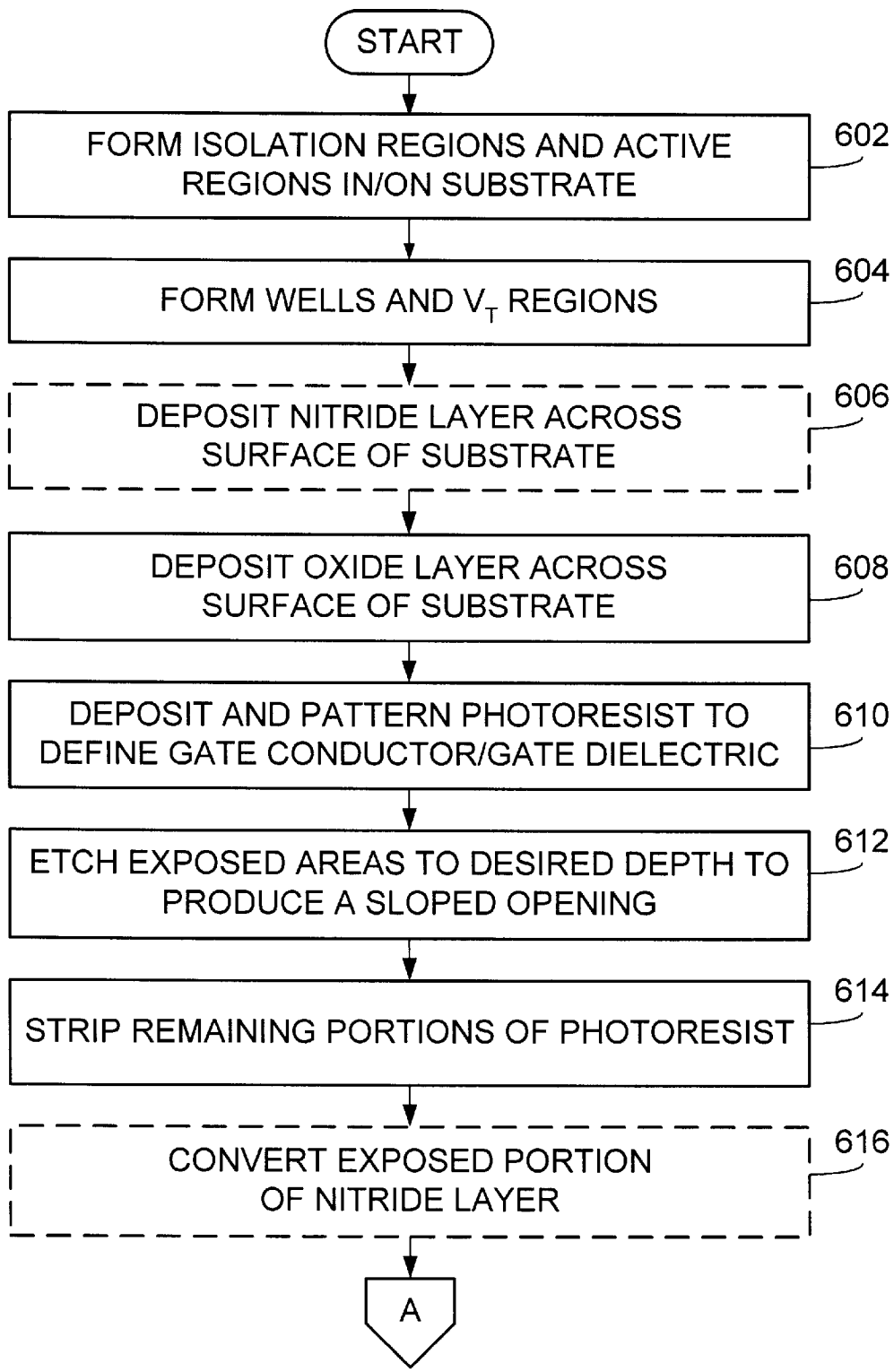
FIG. 6 is a flow chart illustrating a first series of steps of a method for forming a transistor upon a semiconductor substrate according to the present invention.

FIG. 6 is a flow chart illustrating a first series of steps of a method for forming a transistor upon a semiconductor substrate according to the present invention. Operation commences at step 602 wherein isolation regions and active regions are formed in and on the substrate. Once the active regions and isolation regions are formed, operation proceeds to step 604 wherein wells and Vt regions are formed by doping and/or implanting impurities into the substrate. As will be appreciated, the wells and Vt regions may be formed later in the fabrication process using known techniques.

Next, at step 606, a nitride layer is optionally deposited or grown across the surface of the substrate above the active regions and isolation regions to a thickness of between 8 and 15 Angstroms. While such a nitride layer 106 was illustrated in the prior Figures, in another embodiment, the nitride layer 106 is not formed. Thus, step 606 is optional.

From step 606, operation proceeds to step 608 wherein an oxide layer is deposited across the surface of the substrate to a thickness of between 1200 and 2500 Angstroms. The, at step 610, a photoresist material is deposited and patterned to form a patterned mask. The patterned mask defines a gate conductor/gate dielectric region in which sloped etching will subsequently be performed at step 612. In performing the sloped etching at step 612, a polymer is selective applied so that it adheres to the sidewall of the patterned photoresist. Then, a number of short etch steps is performed. The polymer will resist etching and migrate during the short etch steps. With the migration of the polymer and the short etch steps, a stair step etch pattern will result that creates a sloped etching profile.

In one embodiment of the present invention, the sloped etch step proceeds through the oxide layer but does not extend into the nitride layer, as was described with reference to FIGS. 2A th rough 2F. In a second embodiment, the sloped etch step proceeds fully through the oxide layer and through a portion of the nitride layer, as was described with reference to FIGS. 3A through 3F. Finally, in a third embodiment, the sloped etch step proceeds fully through both the oxide layer an d the nitride layer to a surface of the active region, as was described with reference to FIGS. 4A through 4F.

Once the sloped etching process of step 612 is completed, remaining portions of the patterned mask are stripped at step 614. Then, at optional step 616, the remaining exposed portions of the nitride layer are converted to another material such as an oxynitride. As is evident, such a conversion step 616 may be performed only if all or some of the nitride layer remains after the sloped etch step.

Figure 7:
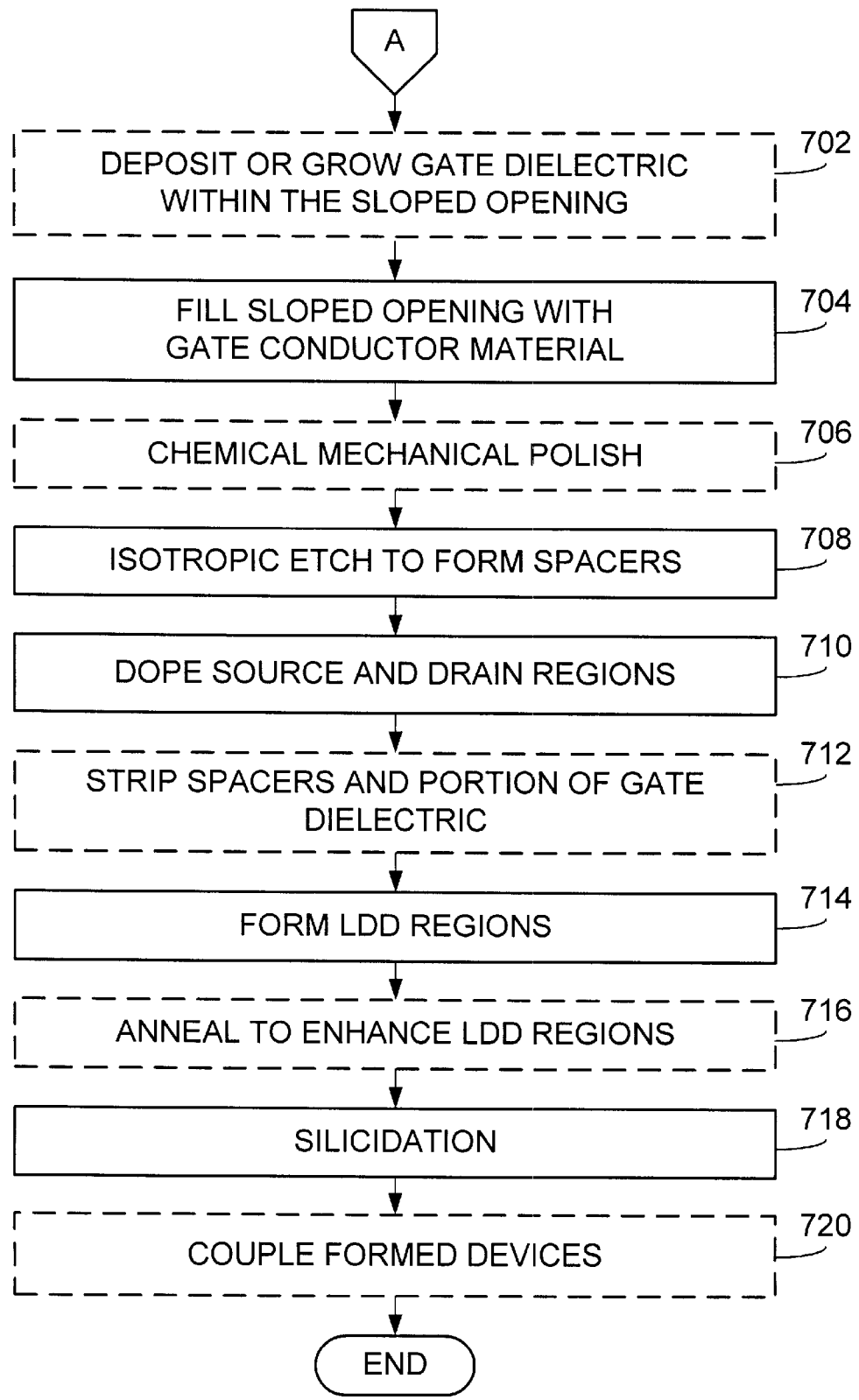
FIG. 7 is a flow chart illustrating a second series of steps of a method for forming a transistor upon a semiconductor substrate according to the present invention.

FIG. 7 is a flow chart illustrating a second series of steps of a method for forming a transistor upon a semiconductor substrate according to the present invention. Referring now to optional step 702 of FIG. 7, a dielectric layer is grown or deposited within the void created by the sloped etch step. Such material may be an oxide, a nitride or another material with a dielectric strength greater than approximately K=4. Then, at step 704, the void created by the sloped etch step and the formed gate dielectric, if any, are filled with a gate conductor material. As described, the gate conductor material may be a polymer that is conductive, or subsequently made conductive, or a metal. The, at optional step 706, the surface of the substrate is planarized in a chemical mechanical polishing step to remove surface irregularities.

Then, at step 708, the substrate is isotropically etched to the surface of the active regions and the isolation regions. The remaining gate structure includes the gate conductor, a gate dielectric (if such was formed), a remaining portion of the nitride layer below the gate conductor (if the nitride layer was formed and if a portion remains), a remaining portion of the nitride layer adjacent the gate conductor (if the nitride layer was formed) and spacers formed from remaining portions of the oxide layer.

Next, the source and drain regions are doped at step 710. Then, optionally, at step 712, the spacers are striped along with portions of the formed gate dielectric (if any) and portions of the nitride layer (if any) adjacent the gate conductor. Subsequent to step 714, LDD regions are formed using the TEOS process or another known spacer formation process. Then, at optional step 716, the substrate is annealed to repair damage created in the active regions and further to form the LDD regions. Then, at step 718 a silicidation step is performed to enhance the surface conductivity of the source and drain regions and the gate conductor. Finally, at step 720, the formed devices are intercoupled to form an integrated circuit.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

We claim:
1. A transistor formed on a semiconductor substrate, the transistor comprising:
   a source formed in the semiconductive substrate;
   a drain formed in the semiconductive substrate;
   a channel defined in the semiconductive substrate between the source and the drain;
   a gate dielectric residing above the channel; and
   a gate conductor residing upon the gate dielectric, the gate conductor having an upper surface, a lower surface, and sloped sidewalls, the lower surface residing upon the gate dielectric, the upper surface having a larger area than the lower surface such that the length of the channel is less than a corresponding length of the upper surface of the gate conductor, wherein a cross-sectional shape of the gate conductor corresponds to a cross-sectional shape of a slope etched void that was formed in an oxide layer that was deposited and slope etched to form the slope etched void.

2. The transistor of claim 1, wherein the gate dielectric comprises an oxide layer portion that was formed from the oxide layer.

3. The transistor of claim 1, wherein the gate dielectric comprises:
   a nitride layer portion that was deposited upon the semiconductive substrate; and
   an oxide layer portion that resides upon the nitride layer portion and that was formed from the oxide layer.

4. The transistor of claim 1, further comprising:
   a well;
   a voltage threshold region;
   a lightly doped drain region; and
   a punchthrough region.

5. The transistor of claim 1, further comprising tapered spacers residing adjacent the gate conductor, wherein the tapered spacers were formed from the oxide layer and correspond to the cross-sectional shape of the slope etched void.

6. The transistor of claim 1, further comprising:
   a dielectric layer formed adjacent the sidewalls and the lower surface of the gate conductor that corresponds to the shape of the slope etched void.

7. The transistor of claim 1, wherein:
   the gate dielectric comprises a portion of a nitride layer portion that was deposited; and
   the gate conductor resides upon the portion of the nitride layer.

8. A transistor formed on a semiconductor substrate, the transistor comprising:
   a source formed in the semiconductive substrate;
   a drain formed in the semiconductive substrate;
   a channel defined in the semiconductive substrate between the source and the drain;
   a gate dielectric residing above the channel;
   a gate conductor residing upon the gate dielectric, the gate conductor having an upper surface, a lower surface, and sloped sidewalls, the lower surface residing upon the gate dielectric, the upper surface having a larger area than the lower surface such that the length of the channel is less than a corresponding length of the upper surface of the gate conductor, wherein a cross-sectional shape of the gate conductor corresponds to a cross-sectional shape of a slope etched void that was formed in an oxide layer that was deposited and slope etched to form the slope etched void; and wherein the gate dielectric comprises an insulative film that resides upon the channel and that also resides adjacent the sloped sidewalls of the gate conductor.

9. The transistor of claim 8, wherein the gate dielectric further comprises a nitride layer portion that resides upon the semiconductive substrate.

10. The transistor of claim 8, further comprising tapered spacers residing adjacent the gate conductor that were formed from the oxide layer.

11. The transistor of claim 8, further comprising:
a well;
a voltage threshold region;
a lightly doped drain region; and
a punchthrough region.

12. The transistor of claim 8, further comprising tapered spacers residing adjacent the gate conductor.

* * * * *